United States Patent
Diggins

(10) Patent No.: US 9,875,797 B1
(45) Date of Patent: Jan. 23, 2018

(54) PHOTON MEMORY SYSTEM

(71) Applicant: Alex Diggins, San Francisco, CA (US)

(72) Inventor: Alex Diggins, San Francisco, CA (US)

( * ) Notice: Subject to any disclaimer, the term of this patent is extended or adjusted under 35 U.S.C. 154(b) by 0 days.

(21) Appl. No.: 15/368,671

(22) Filed: Dec. 4, 2016

(51) Int. Cl.
G11C 16/06 (2006.01)
G11C 13/04 (2006.01)

(52) U.S. Cl.
CPC .................... *G11C 13/047* (2013.01)

(58) Field of Classification Search
CPC ..................................... G11C 13/047
USPC .................. 365/64, 185.03, 185.25
See application file for complete search history.

(56) References Cited

U.S. PATENT DOCUMENTS

| | | | |
|---|---|---|---|
| 5,414,266 A | 5/1995 | Sun | |
| 6,181,662 B1 | 1/2001 | Krieger et al. | |
| 6,522,616 B1 | 2/2003 | Magnitski et al. | |
| 6,858,861 B2 | 2/2005 | Gebele et al. | |
| 7,175,086 B2 | 2/2007 | Gascoyne et al. | |
| 8,115,707 B2 * | 2/2012 | Nathan | G09G 3/3233 315/169.3 |
| 8,503,277 B1 | 8/2013 | Repin | |
| 2003/0081532 A1 | 5/2003 | Gibson | |
| 2011/0090747 A1 * | 4/2011 | Tailliet | G11C 16/06 365/189.16 |
| 2013/0099700 A1 * | 4/2013 | Kreye | H05B 37/02 315/320 |
| 2013/0198589 A1 * | 8/2013 | Choi | G06F 11/1072 714/773 |
| 2014/0047169 A1 * | 2/2014 | Seo | G06F 12/0246 711/103 |
| 2014/0329339 A1 * | 11/2014 | Chaji | G01R 31/26 438/10 |
| 2016/0027382 A1 * | 1/2016 | Chaji | G09G 3/006 345/212 |

FOREIGN PATENT DOCUMENTS

GB 2492950 1/2013
KR 1020120110196 A 10/2012

* cited by examiner

*Primary Examiner* — Anthan Tran
(74) *Attorney, Agent, or Firm* — Fidel D. Nwamu; Nwamu, P.C.

(57) ABSTRACT

A photon memory system. The photon memory system includes a first memory cell having a first memory cell output and a second memory cell output. The first memory cell also includes an LED (Light Emitting Diode) and a photo dot region that includes phosphorescent material. The first memory cell can be charged to first, second, and third initial values for a first memory cell output voltage across the first and second memory cell outputs. The first memory cell output voltage changes from the first, second, and third initial value towards zero. The first memory cell includes a read circuit electrically connected to the first and second memory cell outputs. The read circuit can distinguish first, second, and third voltage ranges of the first memory cell output voltage. The first, second, and third voltage ranges do not overlap with one another.

24 Claims, 3 Drawing Sheets

PHOTON MEMORY SYSTEM

BACKGROUND OF THE DISCLOSURE

The present disclosure relates generally to digital memory systems, and more specifically, to digital memory systems that utilize light for storing information in photon memory cells.

In a conventional photon memory system, light is used to write and store values in photon memory cells. For example, light can be used to illuminate a photon memory cell so as to write a value of 1 (one) into the cell. Conversely, the storage value of the photon memory cell is 0 (zero) when there is no light illumination. After light is received and a value of 1 (one) is stored, the photon memory cell continuously emits photons to reflect the stored value of 1 (one). However, this photon emission often slows down in rate (i.e., number of emitted photons per second) and becomes so weak that the storage value of the photon memory cell becomes 0 (zero).

It is thus within the aforementioned context that a need for the present disclosure has arisen. The present disclosure meets this need by addressing disadvantages of conventional systems and methods to provide a more efficient photon memory system.

SUMMARY OF THE DISCLOSURE

Various aspects of a photon memory system can be found in exemplary embodiments of the present disclosure.

In one embodiment, the memory system includes a first memory cell that has at least two outputs, namely a first memory cell output and a second memory cell output. The first memory cell might further include an LED (Light Emitting Diode) and a photo dot region that includes phosphorescent material.

In response to the LED generating light, the photo dot region absorbs a portion of the light to emit a second light output. The first memory cell also includes a photodiode that has the first memory cell output and the second memory cell output. After the photo dot region emits the second light, the photodiode absorbs part of the second light and generates a first output voltage across the first memory cell output and second memory cell output.

In one embodiment, the first memory cell can be charged to an initial value that generates the first output voltage across the first and second memory cell outputs. This first output voltage changes from the initial value towards zero.

The first memory cell may be charged to a second initial value for the first memory cell output voltage. The first memory cell output voltage decreases from the second initial value towards zero. The first memory cell can be charged to a third initial value for the first memory cell output voltage. The first memory cell output voltage changes from the third initial value towards zero.

The memory system also includes a read circuit electrically connected to the first and second memory cell outputs. The read circuit can distinguish the first, second, and third voltage ranges of the first memory cell output voltage, and the first, second, and third voltage ranges do not overlap one another.

In another embodiment, a memory system operation method is disclosed. The method includes (a) providing a memory system that includes a memory cell which includes first and second memory cell outputs. The memory cell can be charged to a first initial value for a memory cell output voltage across the first and second memory cell outputs. The memory cell output voltage changes from the first initial value towards zero along a first line on a graph having the memory cell output voltage as a vertical axis and time as a horizontal axis.

The memory cell can be charged to a second initial value for the memory cell output voltage. The memory cell output voltage then changes from the second initial value towards zero along a second line on the graph. The memory cell can be charged to a third initial value for the memory cell output voltage. The memory cell output voltage then changes from the third initial value towards zero along a third line on the graph.

The memory cell also includes a read circuit electrically connected to the first and second memory cell outputs, wherein the read circuit is capable of distinguishing first, second, and third voltage ranges of the memory cell output voltage, and wherein the first, second, and third voltage ranges do not overlap one another.

The method of the present disclosure performs a first recharge of the memory cell at a first time point; and performs a first read of the memory cell using the read circuit at a second time point. The second time point is (1) after a pre-specified time point, and (2) before or at the first time point.

In another embodiment, the present disclosure provides a memory system that includes a first memory cell which itself includes a first memory cell output and a second memory cell output. The first memory cell can be charged to a first arbitrary initial value for a first memory cell output voltage across the first and second memory cell outputs. The first memory cell output voltage changes from the first arbitrary initial value towards zero. The second memory cell output is electrically connected to ground.

The memory system includes a second memory cell which includes third and fourth memory cell outputs. The second memory cell can be charged to a second arbitrary initial value for a second memory cell output voltage across the third and fourth memory cell outputs. The second memory cell output voltage changes from the second arbitrary initial value towards zero. The fourth memory cell output is electrically connected to ground.

The memory system includes a read circuit electrically connected to the first and third memory cell outputs, wherein the read circuit is capable of distinguishing first and second voltage ranges of a difference of the first and second memory cell output voltages, and wherein the first and second voltage ranges do not overlap with each other.

In an alternate embodiment, the present disclosure provides a memory system operation method having combined memory cells, which include a first memory cell, a second memory cell and a read circuit. The first memory cell has a first memory cell output, and a second memory cell output. Here, the first memory cell can be charged to a first arbitrary initial value for a first memory cell output voltage across the first and second memory cell outputs. The first memory cell output voltage changes from the first arbitrary initial value towards zero. The second memory cell output is electrically connected to ground. The first memory cell output is a first combined cell output of the combined memory cells.

The second memory cell includes third and fourth memory cell outputs. The second memory cell can be charged to a second arbitrary initial value for a second memory cell output voltage across the third and fourth memory cell outputs. The second memory cell output voltage changes from the second arbitrary initial value towards zero. The fourth memory cell output is electrically connected to ground. The third memory cell output is considered a second combined cell output of the combined memory cell.

The read circuit is electrically connected to the first and second combined cell outputs. The read circuit can distinguish first and second voltage ranges of a combined cell output voltage across the first and second combined cell outputs of the combined memory cell. The first and second voltage ranges do not overlap with each other. The method also includes performing a first write of a first pre-specified initial value for the combined cell output voltage.

Among other advantages, the present disclosure provides a photon memory cell that can store three or more digital values and is thus more efficient over conventional systems that can store no more than two digital values. The present disclosure also provides a photon memory cell that has longer recharge cycles over that are longer than those of a conventional photon memory cells. That is, photon memory cell recharges occur less frequently over conventional photon memory cell systems.

DETAILED DESCRIPTION OF THE DISCLOSURE

Figure 1:
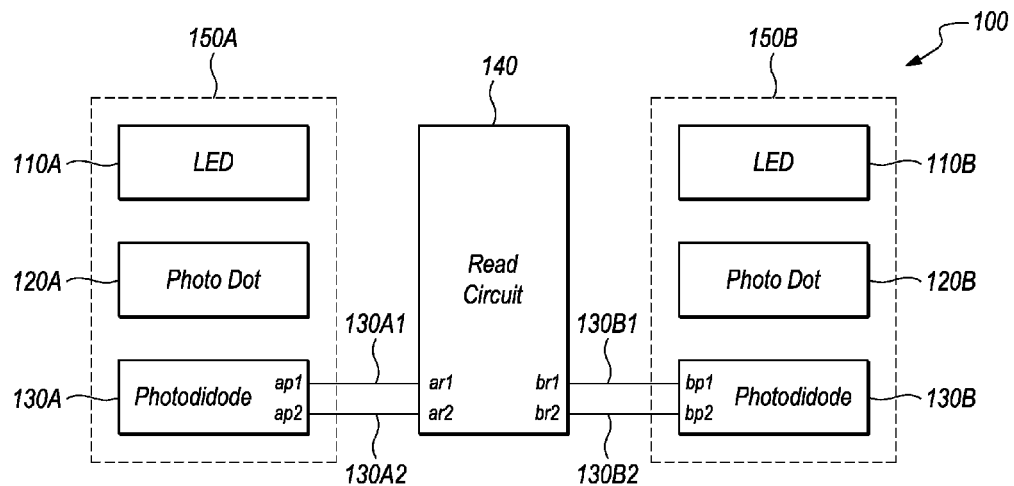
FIG. 1 illustrates a memory system 100, in accordance with embodiments of the present disclosure.

FIG. 1 illustrates a memory system 100, in accordance with embodiments of the present disclosure. More specifically, the memory system 100 comprises LEDs (Light Emitting Diodes) 110A and 110B, photo dots 120A and 120B, photodiodes 130A and 130B, and a read circuit 140.

In one embodiment, outputs ap1 and ap2 of the photodiode 130A are electrically connected to inputs ar1 and ar2 of the read circuit 140 via connections 130A1 and 130A2, respectively. Similarly, outputs bp1 and bp2 of the photodiode 130B are electrically connected to inputs br1 and br2 of the read circuit 140 via connections 130B1 and 130B2, respectively.

In one embodiment, the LED 110A is a typical LED which is capable of emitting light when a certain voltage is properly applied to it (i.e., the LED 110A is turned on).

In one embodiment, the photo dot 120A is a region of a phosphorescent material. The phosphorescent material can be a typical phosphorescent material which is capable of (a) absorbing light incident on it and thereby changing from a stable state to an excited state, and (b) emitting light while gradually changing from the excited state back to the stable state. It should be noted that the light emission may continue even after the light absorption has stopped. In one embodiment, the photo dot 120A is proximate to the LED 110A such that light emitted by the LED 110A is absorbed partly or completely by the photo dot 120A.

In one embodiment, the photodiode 130A might be conventional. More specifically, the photodiode 130A is capable of absorbing incident light and can generate a voltage across its two outputs ap1 and ap2 (namely Vap1ap2). In one embodiment, as long as the photodiode 130A absorbs light from the photo dot 120A, the photodiode 130A maintains the voltage Vap1ap2, wherein Vap1ap2 is proportional to the rate at which photons from the photo dot 120A are absorbed by the photodiode 130A. In one embodiment, the photodiode 130A and the photo dot 120A are proximate such that light emitted by photo dot 120A is absorbed partly or completely by the photodiode 130A.

In one embodiment, the LED 110A, the photo dot 120A, and the photodiode 130A form a photon memory cell 150A which has outputs ap1 and ap2 and an output voltage Vap1ap2.

Generally, a write operation of the photon memory cell 150A is as follows. The LED 110A is turned on to project light on the photo dot 120A for a period of time and then the LED 110A is turned off. After absorbing light from the LED 110A, the photo dot 120A gradually emits light to the photodiode 130A which generates voltage Vap1ap2. Vap1ap2 is later read and interpreted by the read circuit 140 during a read operation. Here, the gradual light emission by the photo dot 120A continues even after the LED 110A is turned off and that voltage Vap1ap2 decreases to 0V while the light emission by photo dot 120A decreases to zero.

In general, the LED 110A is used to write an initial value of Vap1ap2 into the photon memory cell 150A; and Vap1ap2 while slowly decreasing to 0V is read and interpreted by the read circuit 140 during a read operation via Var1ar2 (Var1ar2=Vap1ap2).

In one embodiment of the present disclosure, the LED 110B, the photo dot 120B, and the photodiode 130B form a photon memory cell 150B. The photon memory cell 150B is similar to the photon memory cell 150A in terms of structure and operation.

In the embodiments described above, the memory system 100 comprises two photon memory cells 150A and 150B. In general, the memory system 100 can comprise N photon memory cells similar to the photon memory cell 150A in terms of structure and operation, where N is a positive integer.

Figure 2A:
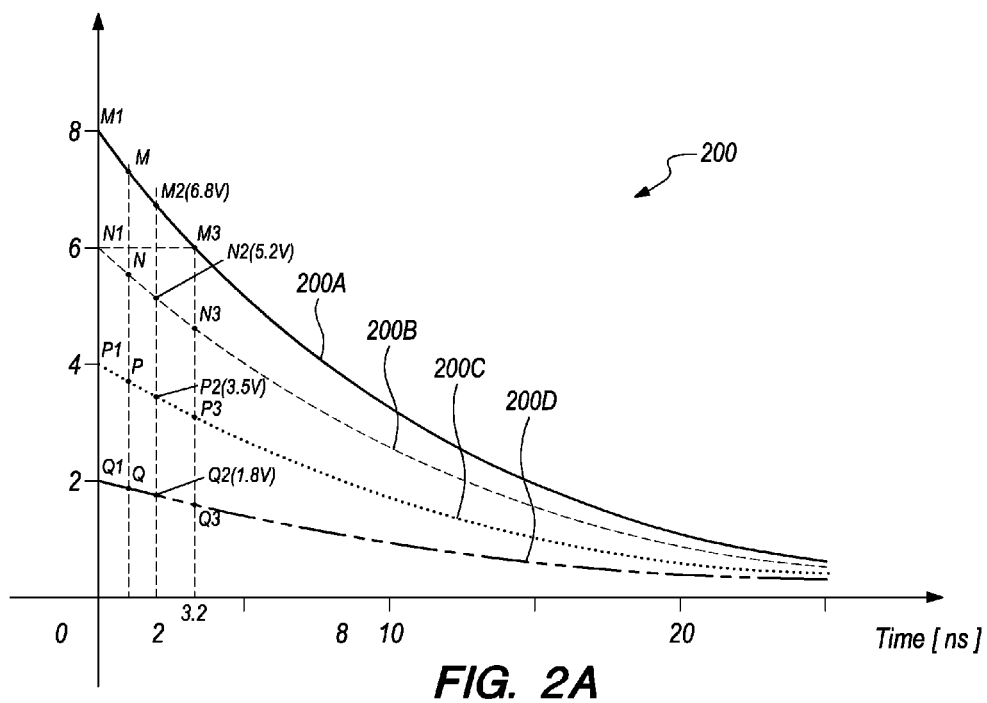
FIG. 2A illustrates the operation of the memory system of FIG. 1, in accordance with embodiments of the present disclosure.
Figure 2A:
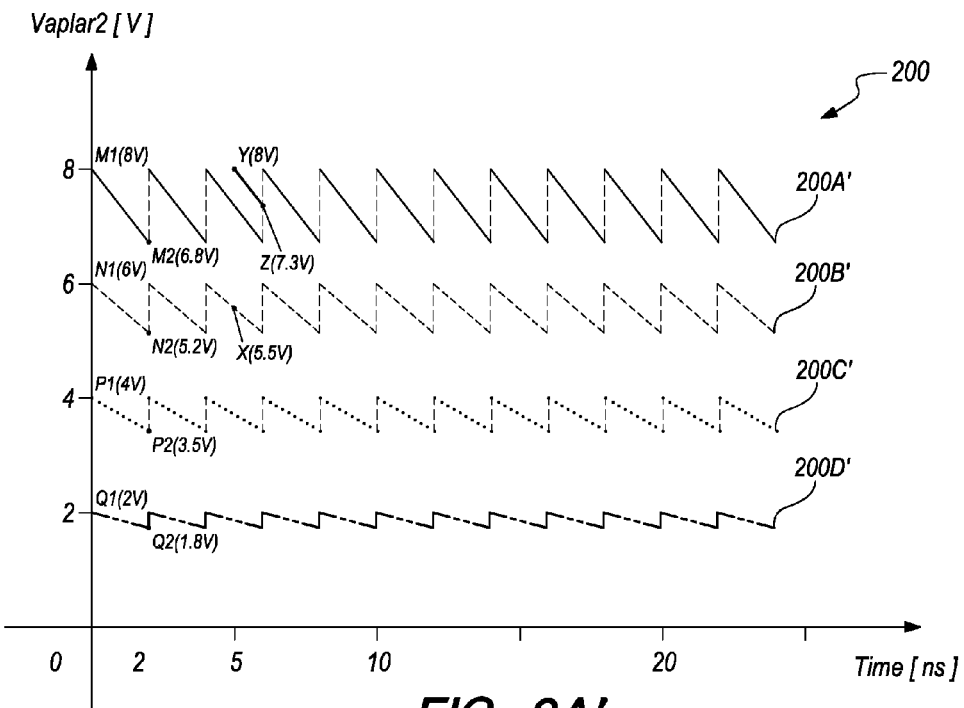

FIGS. 2A, 2A', 2B, and 2B' illustrate the operation of the memory system 100 of FIG. 1, in accordance with embodiments of the present disclosure.

More specifically, FIGS. 2A and 2A' illustrate the operation of the memory system 100 of FIG. 1 based on an early recharge scheme, in accordance with embodiments of the present disclosure. More specifically, FIG. 2A is a graph 200 which illustrates the change of Vap1ap2 (vertical axis) through time (horizontal axis) in the first, second, third, and fourth examples represented by lines 200A, 200B, 200C, and 200D, respectively. These four examples illustrate digital values that can be stored in the photon memory cell 150A of FIG. 1. Here, Var1ar2=Vap1ap2 for the memory system 100 of FIG. 1.

With reference to FIGS. 1 & 2A, in the first example represented by the line 200A, at time t=0 ns, the LED 110A is used to write an initial value Vap1ap2=8V into the photon memory cell 150A. As time elapses, the light emission by the photo dot 120A (FIG. 1) decreases causing Vap1ap2 to also decrease from its initial value of 8V. A recharge of the photon memory cell 150A occurs by writing into the photon memory cell 150A the initial value of Vap1ap2 corresponding to the digital content of the photon memory cell 150A. The photon memory cell 150A must be recharged before Vap1ap2 is close to 0. Also, conveniently, because Vap1ap2 decreases from its initial value of 8V, the photon memory cell 150A can be said to be written with a digital value of 8.

The second, third, and fourth examples are similar to the first except that the LED 110A (FIG. 1) is used to write initial values 6V, 4V, and 2V for Vap1ap2 into the photon memory cell 150A, respectively. Conveniently, it is said that digital values of 6, 4, and 2, are written into the photon memory cell 150A in the second, third, and fourth examples, respectively.

Let four points M, N, P, and Q represent Vap1ap2 with respect to time for the first, second, third, and fourth examples, respective. As a result, at t=0 ns, the points M, N, P, and Q are M1, N1, P1, and Q1, respectively. As time progresses, the points M, N, P, and Q move down along the lines 200A, 200B, 200C, and 200D, respectively.

In the early recharge scheme, a recharge must be performed before the four projections of M1M, N1N, P1P, and Q1Q on the vertical axis overlap with one another. The four projections begin to overlap with one another when M, N, P, and Q reach M3, N3, P3, and Q3, respectively, where M3 and N1 are both 6V. This happens when t=3.2 ns.

As a result, a recharge can be performed at, for example, t=2 ns<3.2 ns. At time t=2 ns, M, N, P, and Q are M2, N2, P2, and Q2, respectively. The four projections of M1M2, N1N2, P1P2, and Q1 Q2 on the vertical axis are the ranges (6.8, 8), (5.2, 6), (3.5, 4), and (1.8, 2), respectively; and these four ranges on the vertical axis clearly do not overlap with one another.

In one embodiment, the read circuit 140 (FIG. 1) is capable of distinguishing these four voltage ranges (6.8, 8); (5.2, 6); (3.5, 4); and (1.8, 2) from one another. The design of the read circuit 140 that provides this capability is well known in the art. As a result, if a read is performed at 0 ns<t<2 ns, then the read circuit 140 can determine the digital content of the photon memory cell 150A. For example, assume that a read is performed at t=1 ns, and that Vap1ap2=5.5V at t=1 ns, then the read circuit 140 can determine that the photon memory cell 150A stores a digital value of 6.

In one embodiment, a recharge is performed every 2 ns. FIG. 2A' illustrates the resulting effect on FIG. 2A. More specifically, in FIG. 2A', line 200A' represents Vap1ap2 when an 8 is written into the photon memory cell 150A (FIG. 1) at t=0, and then a recharge is performed every 2 ns. Similarly, line 200B' represents Vap1ap2 for when a value of 6 is written into the photon memory cell 150A at t=0, and then a recharge is performed every 2 ns. Line 200C' represents Vap1ap2 for when a value of 4 is written into the photon memory cell 150A at t=0, and then a recharge is performed every 2 ns. Line 200D' represents Vap1ap2 for when a value of 2 is written into the photon memory cell 150A at t=0, and then a recharge is performed every 2 ns.

It is clear from FIG. 2A' that the four projections of the lines 200A', 200B', 200C', and 200D' on the vertical axis do not overlap with one another. As a result, the read circuit 140 can read and determine the content of photon memory cell 150A at any time.

In one embodiment, when a recharge is performed, the initial value of Vap1ap2 corresponding to the current content of the photon memory cell 150A is written to the photon memory cell 150A. For example, assume at t=2, the photon memory cell 150A stores a value of 6. So, the initial value of Vap1ap2 corresponding to a digital content of 6 is 6V. So, at t=2 ns, Vap1ap2 is recharged from 5.2V (point N2 of the line 200B') up to 6V.

In one embodiment, writing a digital value into the photon memory cell 150A can be performed at any preferred time by charging Vap1ap2 to the initial value of Vap1ap2 corresponding to the digital value of the photon memory cell 150A. For example, assume that at t=5 ns, the photon memory cell 150A (FIG. 1) stores a digital value of 6. So, Vap1ap2=5.5V (point X of the line 200B'). Assume further that at t=5 ns, a value of 8 is to be written into the photon memory cell 150A. So, Vap1ap2 is charged from 5.5V (point X of line 200B') to 8V (point Y), which is the initial value of Vap1ap2 corresponding to the digital value of 8. As time progresses, Vap1ap2 falls, as represented by line segment YZ until the next recharge at t=6 ns. Thereafter, Vap1ap2 is represented by the line 200A'.

Figure 2B:
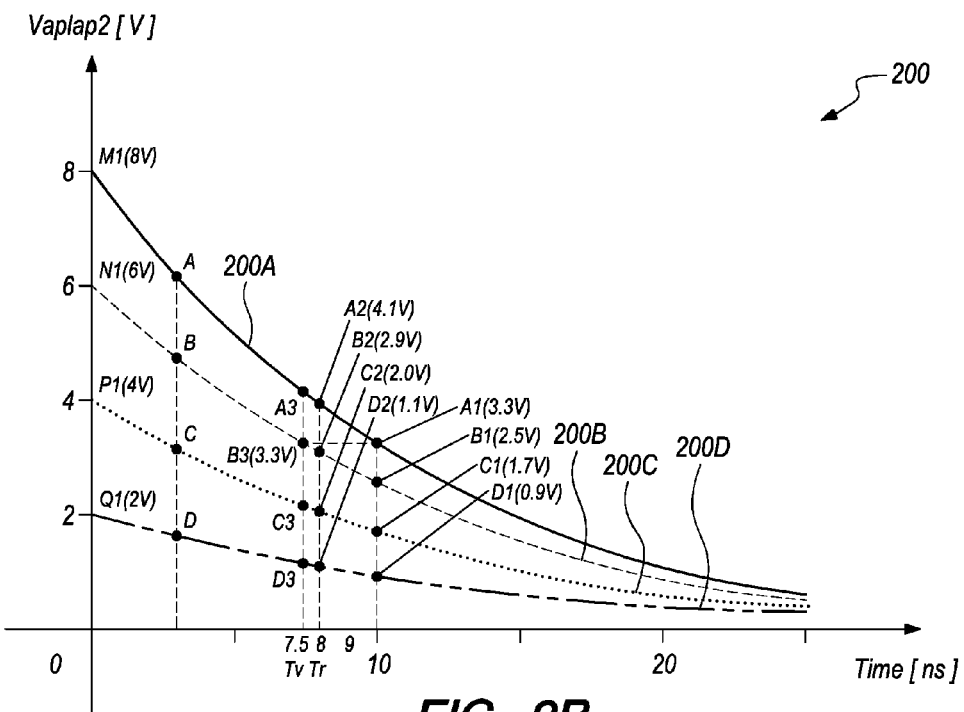
FIG. 2B illustrates the operation of the memory system of FIG. 1, in accordance with embodiments of the present disclosure.
Figure 2B:
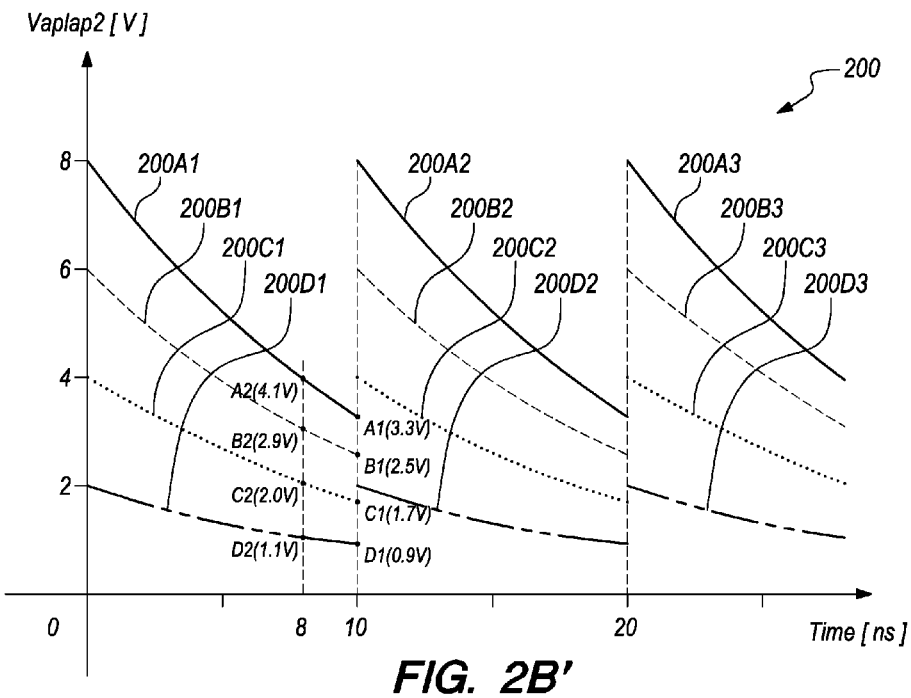

FIGS. 2B and 2B' help illustrate the operation of the memory system 100 of FIG. 1 based on a late recharge scheme, in accordance with embodiments of the present disclosure. FIG. 2B is the graph 200 of FIG. 2A except that a recharge is performed at t=10 ns (instead of at t=2 ns as in FIG. 2A).

With reference to FIG. 2B, assume that the vertical line t=10 ns intersects the lines 200A, 200B, 200C, and 200D at A1, B1, C1, and D1, respectively. This recharge scheme is late because at t=10 ns, the projections of the line segments M1A1, N1B1, P1C1, and Q1D1 on the vertical axis already overlap one another. For instance, the voltage value of point A1 (3.3V) is less than voltage value of point N1 (6V) making the projections of M1A1 and N1B1 on the vertical axis overlap each other. As a result, it is too late for a read to be performed at any time before the recharge (as further described below, a read in this late recharge scheme must be performed sufficiently close to the recharge).

Let four points A, B, C, and D represent Vap1ap2 with respect to time for the first, second, third, and fourth examples, respectively. As a result, at t=0 ns, the points A, B, C, and D are M1, N1, P1, and Q1, respectively. As time progresses, the points A, B, C, and D move down along the lines 200A, 200B, 200C, and 200D, respectively.

In the late recharge scheme, a read must be performed after the four projections of A1A, B1B, C1C, and D1D on the vertical axis are on the verge of no longer overlapping one another. The 4 projections begins to cease overlapping one another when A, B, C, and D get to A3, B3, C3, and D3, respectively, where B3 and A1 have the same voltage value of 3.3V. This happens when t=7.5 ns. So, a read must be performed after t=7.5 ns.

As a result, a read can be performed at, for example, t=8 ns. Assume the vertical line t=8 ns intersects the lines 200A, 200B, 200C, and 200D at A2, B2, C2, and D2, respective. It should be noted that the projections of the line segments A1A2, B1B2, C1C2, and D1D2 on the vertical axis are the ranges (3.3, 4.1), (2.5, 2.9), (1.7, 2.0), and (0.9, 1.1), respectively, and that these 4 ranges on the vertical axis do not overlap one another. In one embodiment, the read circuit 140 (FIG. 1) is capable of distinguishing the four voltage ranges (3.3, 4.1); (2.5, 2.9); (1.7, 2.0); and (0.9, 1.1) from one another.

In one embodiment, recharges are performed periodically, and more specifically, every 10 ns, and FIG. 2B' illustrates the resulting effect on FIG. 2B. More specifically, with reference to FIG. 2B', line 200A1+200A2+200A3 . . . shows Vap1ap2 for the case where an 8 is written into the photon memory cell 150A (FIG. 1) at t=0, and then a recharge is performed every 10 ns.

Similarly, line 200B1+200B2+200B3 ... shows Vap1ap2 for the case where a 6 is written into the photon memory cell 150A at t=0, and then a recharge is performed every 10 ns. Line 200C1+200C2+200C3 ... shows Vap1ap2 for the case where a 4 is written into the photon memory cell 150A at t=0, and then a recharge is performed every 10 ns. Line 200D1+200D2+200D3 ... shows Vap1ap2 for the case where an 2 is written into the photon memory cell 150A at t=0, and then a recharge is performed every 10 ns.

In one embodiment, a read (if any) in a recharge cycle (a recharge cycle is the time period between two consecutive recharges) is performed at a constant distance from the upcoming recharge. For example, a read can be performed 1 ns before the next recharge (i.e., at t=9 ns, or 19 ns, or 29 ns, etc).

In one embodiment, a read is performed when a recharge is performed (i.e., the constant distance mentioned above is zero). This is possible because a recharge naturally includes a read to determine the current content of the photon memory cell 150.

In one embodiment of the present disclosure, a write of a digital value into the photon memory cell 150A is performed at recharge (i.e., at t=10 ns, or 20 ns, or 30 ns, etc). More specifically, at a recharge time, if no write is to be performed for the photon memory cell 150A, then a recharge is performed for the photon memory cell 150A. But if a write of a digital value is to be performed for the photon memory cell 150A at the recharge time, then that write instead of a recharge is performed for the photon memory cell 150A.

For example, assume at t=10 ns, the photon memory cell 150A is storing a digital value of 2 (point D1 of line 210D1). Assume further that no write is to be performed at t=10 ns for the photon memory cell 150A. As a result, a recharge is performed for the photon memory cell 150A at t=10 ns, and then Vap1ap2 is represented by the line 200D2 for t>10 ns.

Assume alternatively that a write of a digital value of 4 is to be performed at t=10 ns for the photon memory cell 150A. Then, the write of digital value of 4 instead of a recharge is performed for the photon memory cell 150A at t=10 ns, and as a result, Vap1ap2 switches from the line 200D1 to the line 200C2 beyond t=10 ns. Because the recharges and writes are performed every 10 ns, the recharges and the writes together are periodical.

Figure 3:
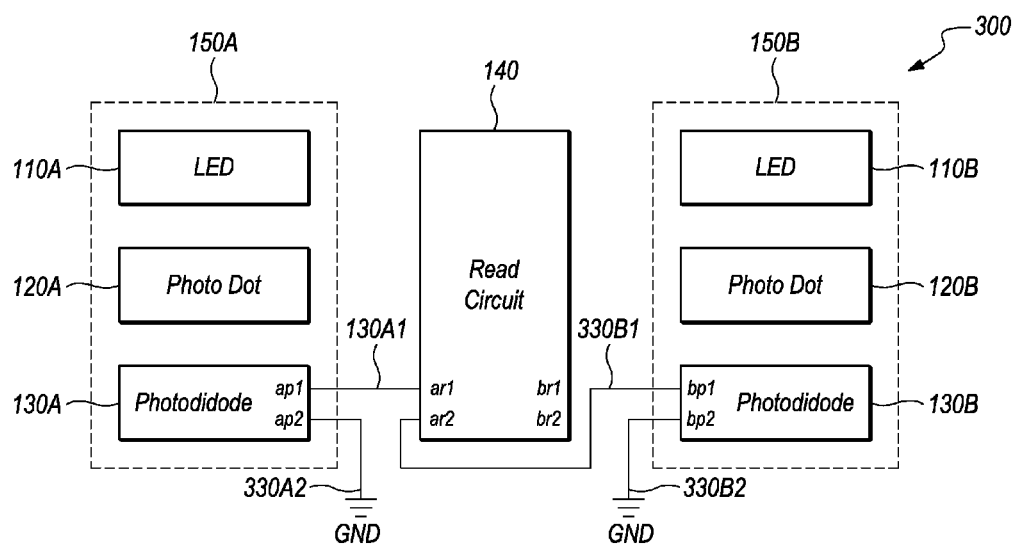
FIG. 3 illustrates a memory system 300, in accordance with embodiments of the present disclosure.

FIG. 3 illustrates a memory system 300, in accordance with embodiments of the present disclosure. In one embodiment of the present disclosure, the memory system 300 and the memory system 100 (FIG. 1) are similar.

However, although the output ap1 of the photodiode 130A and the input ar1 of the read circuit 140 are still electrically connected via the connection 130A1 (as in the memory system 100 of FIG. 1), but the output ap2 of the photodiode 130A is now electrically connected to ground via a connection 330A2.

Regarding the photodiode 130B, its output bp1 is electrically connected to the input art of the read circuit 140 via a connection 330B1, whereas its output bp2 is electrically connected to ground via a connection 330B2.

In one embodiment of the present disclosure, the operation of the memory system 300 is as follows. Assume that Vap1ap2=8V is written into the photon memory cell 150A, whereas Vbp1bp2=6V is written into the photon memory cell 150B. As a result, Vap1bp1 (voltage across the outputs ap1 and bp1)=Vap1ap2−Vbp1bp2=8V−6V=2V. Vap1bp1 applies to the reader circuit 140 as Varlar2.

Although the values of both Vap1ap2 and Vbp1bp2 fall (see the line 200A of FIG. 2A for Vap1ap2, and line 200B of FIG. 2A for Vbp1bp2), the difference Vap1bp1 in value between Vap1ap2 and Vbp1bp2 remains essentially a constant because both Vap1ap2 and Vbp1bp2 drop at the same rate (see FIG. 2A). As a result, a line in FIG. 2A that represents Vap1bp1 (not shown) should look similar to the line 200D of FIG. 2A (because both start dropping from the same initial voltage of 2V), but the slope of the line for Vap1bp1 is much less steep than the slope of the line 200D of FIG. 2A.

In one embodiment, the photon memory cells 150A and 150B form a combined photon memory cell 150A+150B which has the outputs ap1 and bp1 as its outputs. The combined photon memory cell 150A+150B can operate according to either the early recharge scheme or the late recharge scheme. If the combined photon memory cell 150A+150B operates according to the early recharge scheme, then the recharge cycle for the combined photon memory cell 150A+150B is much longer than that of the photon memory cell 150A of FIG. 1 also operating in the early recharge scheme. In other words, when working in pair as in the memory system 300, the photon memory cells 150A and 150B require recharges less often than when they work individually as in the memory system 100 of FIG. 1.

It should be noted that longer recharge cycles are desirable because recharge process is a burden on a memory system and therefore should not be performed too often. In general, the memory system 300 can have K combined photon memory cells similar to the combined photon memory cell 150A+150B in terms of structure and function, where K is a positive integer.

In one embodiment of the present disclosure, Vbp1bp2 is fixed while Vap1ap2 is flexible so as to achieve the desired Vap1bp1. For example, Vbp1bp2 can be fixed at 3V (i.e., in any write into the combined photon memory cell 150A+150B, the memory cell 150B is always written into with Vbp1bp2=3V). As a result, if Vap1bp1=2V is to be written into the combined photon memory cell 150A+150B, then a value Vap1ap2=5V needs to be written into the photon memory cell 150A. Alternatively, if Vap1bp1=4V is to be written into the combined photon memory cell 150A+150B, then a value Vap1ap2=7V needs to be written into the photon memory cell 150A. Alternatively, if Vap1bp1=6V is to be written into the combined photon memory cell 150A+150B, then a value Vap1ap2=9V needs to be written into the photon memory cell 150A.

In one embodiment of the present disclosure, with reference to FIGS. 1 & 3, writing an initial value (8V for instance) for Vap1ap2 to the photon memory cell 150A is performed as follows. First, high-wavelength light (such as red or infra-red light) is projected on the photo dot 120A so as to rush the photon emission (if any) by the photo dot 120A to zero. The inventor of the present disclosure has experimentally verified this rush effect on phosphorescent materials caused by high-wavelength light. After the photon emission (if any) by the photo dot 120A is rushed to zero, the LED 110A is controlled (i.e., turned on then off in a controlled manner) so as to write the initial value (8V) of Vap1ap2 to the photon memory cell 150A. This rush effect can be utilized for writing the photon memory cells 150A and 150B whether they work individually as in FIG. 1 or they work in pair as in FIG. 3.

In one embodiment of the present disclosure, with reference to FIG. 3, the read circuit 140 is designed to read and interpret only three digital values of −1, 0, and 1 for the combined photon memory cell 150A+150B. More specifically, the combined photon memory cell 150A+150B stores (a) a digital value of −1 when Vap1bp1<0 (for instance, Vap1ap2 is not charged whereas Vbp1bp2 is charged to a positive voltage), (b) a digital value of 0 when Vap1bp1=0 (e.g., both Vap1ap2 and Vbp1bp2 are charged to their identical maximum voltage), and (c) a digital value of 1 when Vap1bp1>0 (for instance, Vap1ap2 is charged to a positive voltage whereas Vbp1bp2 is not charged). This simple design with only three digital values saves energy.

In FIG. 3, in one embodiment of the present disclosure, writing of an initial value of Vap1bp1 (2V, for example) to the combined photon memory cell 150A+150B is performed as follows. First, LED 110A and LED 110B can be used to respectively charge Vap1ap2 and Vbp1bp2 the same maximum value (10V, for example). Then, both Vap1ap2 and Vbp1bp2 are allowed to drop by 2V (i.e., down to 8V) from their maximum value through photon emission. Finally, Vap1ap2 is again charged to its maximum value (10V) by using the LED 110A. As a result, the initial value of Vap1bp1 is Vap1ap2−Vbp1bp2=10V−8V=2V as desired.

In one embodiment of the present disclosure, with reference to FIGS. 1 & 3, the LED 110A is used to charge the photon memory cell 150A to a certain voltage for Vap1ap2. In one embodiment, the LED 110A is powered by the same voltage for M different charging time periods so as to charge the photon memory cell 150A to M different voltages for Vap1ap2, wherein M is an integer greater than 1. In an alternative embodiment, the LED 110A is powered by N different voltages for the same charging time period so as to charge the photon memory cell 150A to N different voltages for Vap1ap2, wherein N is an integer greater than 1. The photon memory cell 150B can be similarly charged.

In one embodiment of the present disclosure, with reference to FIGS. 1 & 3, the LED 110A and the photodiode 130A are replaced by a direct band gap semiconductor diode (not shown) with equivalent functionality. More specifically, the direct band gap semiconductor diode can be powered by a voltage for a time period so as to generate light to the photo dot 120A during that time period. The photo dot 120A absorbs all or part of the light generated by the direct band gap semiconductor diode and then gradually emits light. This light emission can continue even after the direct band gap semiconductor diode stops generating light. In response to absorbing all or part of the light emitted by the photo dot 120A, the direct band gap semiconductor diode generates a voltage Vap1ap2 across its outputs ap1 and ap2, wherein Vap1ap2 is proportional to the rate of the light emission by the photo dot 120A. In a similar manner, the LED 110B and the photodiode 130B can also be replaced by another direct band gap semiconductor diode (not shown) with equivalent functionality.

In the embodiments described above, the photon memory cell 150A (FIG. 1) has four digital values of 8, 6, 4, and 2. In general, the photon memory cell 150A can have L digital values, wherein L is an integer greater than 1.

With reference to FIG. 2B, the range (3.3, 4.1) of the projection of A1A2 on the vertical axis is greater than the range (2.5, 2.9) of the projection of B1B2 on the vertical axis. In general, a first range is considered greater than a second range if any value of the first range is greater than all values of the second range. Also, as a matter of terminology, a value is considered less than a range if the value is less than all values of the range.

In summary, the photon memory cell 150A (FIG. 1) can store more than two digital values in either the early recharge scheme or the late recharge scheme. In contrast, a conventional photon memory cell of the prior art can store only two digital values of 0 and 1. As a result, the photon memory cell 150A of the present disclosure is more efficient. Having two photon memory cells 150A and 150B working in pair, the combined photon memory cell 150A+150B (FIG. 3) of the present disclosure can have recharge cycles longer than those of a conventional photon memory cell of the prior art. In other words, recharges in the memory system 300 are performed less often than in memory systems of the prior art. As a result, the memory system 300 of the present disclosure is more efficient. The present disclosure can apply also to memory systems having memory cells that lose content due to decreasing voltages over time (such as dynamic random access memories—DRAMs).

While particular embodiments of the present disclosure have been described herein for purposes of illustration, many modifications and changes will become apparent to those skilled in the art. Accordingly, the appended claims are intended to encompass all such modifications and changes as fall within the true spirit and scope of this disclosure.

The invention claimed is:

1. A memory system, comprising:
    a first memory cell which includes first and second memory cell outputs, wherein the first memory cell is configured for charging to a first initial value for a first memory cell output voltage across the first and second memory cell outputs, wherein in response to the first memory cell charging to the first initial value for the first memory cell output voltage, the first memory cell is configured to vary the first memory cell output voltage from the first initial value towards zero,
    wherein the first memory cell is configured for charging to a second initial value for the first memory cell output voltage, wherein in response to the first memory cell charging to the second initial value for the first memory cell output voltage, the first memory cell is configured to vary the first memory cell output voltage from the second initial value towards zero,
    wherein the first memory cell is configured for charging to a third initial value for the first memory cell output voltage, and wherein in response to the first memory cell charging to the third initial value for the first memory cell output voltage, the first memory cell is configured to vary the first memory cell output voltage from the third initial value towards zero; and
    a read circuit electrically connected to the first and second memory cell outputs, wherein the read circuit is configured to distinguish first, second, and third voltage ranges of the first memory cell output voltage, and wherein the first, second, and third voltage ranges do not overlap one another.

2. The memory system of claim 1, wherein the first memory cell comprises:
    (a) a first LED (Light Emitting Diode);
    (b) a first photo dot region including a phosphorescent material, wherein in response to the first LED generating first light, the photo dot region is configured to absorb at least part of the first light and to emit second light; and
    (c) a first photodiode including the first and second memory cell outputs, wherein in response to the first photo dot region emitting the second light, the first photodiode is configured to absorb at least part of the second light and to generate the first memory cell output voltage.

3. The memory system of claim 2, further comprising a second memory cell which includes third and fourth memory cell outputs,
    wherein the second memory cell is configured for charging to the first initial value for a second memory cell output voltage across the third and fourth memory cell outputs, wherein in response to the second memory cell charging to the first initial value for the second memory cell output voltage, the second memory cell is configured to vary the second memory cell output voltage from the first initial value towards zero, wherein the second memory cell is configured for charging to the second initial value for the second memory cell output voltage, wherein in response to the second memory cell charging to the second initial value for the second memory cell output voltage, the second memory cell is configured to vary the second memory cell output voltage from the second initial value towards zero, wherein the second memory cell is configured for charging to the third initial value for the second memory cell output voltage, and wherein in response to the second memory cell charging to the third initial value for the second memory cell output voltage, the second memory cell is configured to vary the second memory cell output voltage from the third initial value towards zero, wherein the read circuit is electrically connected to the third and fourth memory cell outputs, and wherein the read circuit is configured to distinguish the first, second, and third voltage ranges of the second memory cell output voltage.

4. The memory system of claim 3, wherein the second memory cell comprises:

(a) a second LED (Light Emitting Diode);

(b) a second photo dot region including the phosphorescent material, wherein in response to the second LED generating third light, the second photo dot region is configured to absorb at least part of the third light and to emit fourth light; and (c) a second photodiode including the third and fourth memory cell outputs, wherein in response to the second photo dot region emitting the fourth light, the second photodiode is configured to absorb at least part of the fourth light and to generate the second memory cell output voltage.

5. The memory system of claim 1, wherein the first memory cell comprises:

(a) a direct band gap semiconductor diode configured to generate fifth light; and (b) a photo dot region including a phosphorescent material, wherein in response to the direct band gap semiconductor diode generating the fifth light, the photo dot region is configured to absorb at least part of the fifth light and to emit sixth light, and wherein in response to the photo dot region emitting the sixth light, the direct band gap semiconductor diode is configured to absorb at least part of the six light and to generate the first memory cell output voltage.

6. The memory system of claim 1, wherein the first, second, and third initial values belong to the first, second, and third voltage ranges, respectively.

7. The memory system of claim 1, wherein the first voltage range is greater than the second voltage range, wherein the second voltage range is greater than the third voltage range, wherein the first initial value is greater than the second initial value which is greater than the third initial value, and wherein the second initial value is not less than the first voltage range.

8. A memory system operation method, comprising:

(a) providing a memory system including:

a memory cell which includes first and second memory cell outputs, wherein the memory cell is configured for charging to a first initial value for a memory cell output voltage across the first and second memory cell outputs, wherein in response to the memory cell charging to the first initial value for the memory cell output voltage, the memory cell is configured to vary the memory cell output voltage from the first initial value towards zero along a first line on a graph having the memory cell output voltage as a vertical axis and time as a horizontal axis, wherein the memory cell is configured for charging to a second initial value for the memory cell output voltage, wherein in response to the memory cell charging to the second initial value for the memory cell output voltage, the memory cell is configured to vary the memory cell output voltage from the second initial value towards zero along a second line on the graph, wherein the memory cell is configured for charging to a third initial value for the memory cell output voltage, and wherein in response to the memory cell charging to the third initial value for the memory cell output voltage, the memory cell is configured to vary the memory cell output voltage from the third initial value towards zero along a third line on the graph, and a read circuit electrically connected to the first and second memory cell outputs, wherein the read circuit is configured to distinguish first, second, and third voltage ranges of the memory cell output voltage, and wherein the first, second, and third voltage ranges do not overlap one another;

(b) performing a first recharge of the memory cell at a first time point; and (c) performing a first read of the memory cell using the read circuit at a second time point, wherein the second time point is (1) after a pre-specified time point, and (2) before or at the first time point.

9. The memory system operation method of claim 8, wherein the first initial voltage is greater than the second initial voltage, wherein the second initial voltage is greater than the third initial voltage, wherein a recharge vertical line on the graph at the first time point intersects the first line at a point A1, wherein the point A1 has a voltage value less than the second initial value, wherein a point B3 on the second line and the point A1 have the same voltage value, and wherein the pre-specified time point is the time value of the point B3.

10. The memory system operation method of claim 9, further comprising performing additional recharges, wherein the first and additional recharges are performed periodically.

11. The memory system operation method of claim 10, further comprising performing additional reads of the memory cell, wherein each read of the first and additional reads are performed at a constant time distance from a next recharge of the first and additional recharges.

12. The memory system operation method of claim 11, further comprising performing a first write to the memory cell, wherein said performing the first recharge, said performing the additional recharges, and said performing the first write together are periodical.

13. The memory system operation method of claim 12, further comprising performing additional writes to the memory cell, wherein said performing the first recharge, said performing the additional recharges, said performing the first write, and said performing the additional writes together are periodical.

14. The memory system operation method of claim 13, wherein each of said performing the first write and said performing the additional writes comprises shining low-wavelength light on the memory cell.

15. The memory system operation method of claim 8, wherein the first time point and the second time point are identical.

16. A memory system, comprising:
a first memory cell which includes first and second memory cell outputs, wherein the first memory cell is configured for charging to a first arbitrary initial value for a first memory cell output voltage across the first and second memory cell outputs, wherein in response to the first memory cell charging to the first arbitrary initial value for the first memory cell output voltage, the first memory cell is configured to vary the first memory cell output voltage from the first arbitrary initial value towards zero, and wherein the second memory cell output is electrically connected to ground;
a second memory cell which includes third and fourth memory cell outputs, wherein the second memory cell is configured for charging to a second arbitrary initial value for a second memory cell output voltage across the third and fourth memory cell outputs, wherein in response to the second memory cell charging to the second arbitrary initial value for the second memory cell output voltage, the second memory cell is configured to vary the second memory cell output voltage from the second arbitrary initial value towards zero, and wherein the fourth memory cell output is electrically connected to ground; and
a read circuit electrically connected to the first and third memory cell outputs, wherein the read circuit is configured to distinguish first and second voltage ranges of a difference of the first and second memory cell output voltages, and wherein the first and second voltage ranges do not overlap with each other.

17. The memory system of claim 16, wherein the first memory cell includes:
(a) a first LED (Light Emitting Diode);
(b) a first photo dot region including a phosphorescent material, wherein in response to the first LED generating first light, the photo dot region is configured to absorb at least part of the first light and to emit second light; and
(c) a first photodiode including the first and second memory cell outputs, wherein in response to the first photo dot region emitting the second light, the first photodiode is configured to absorb at least part of the second light and to generate the first memory cell output voltage,
wherein the second memory cell includes:
(a) a second LED (Light Emitting Diode);
(b) a second photo dot region including the phosphorescent material, wherein in response to the second LED generating third light, the second photo dot region is configured to absorb at least part of the third light and to emit fourth light; and
(c) a second photodiode including the third and fourth memory cell outputs, wherein in response to the second photo dot region emitting the fourth light, the second photodiode is configured to absorb at least part of the fourth light and to generate the second memory cell output voltage.

18. The memory system of claim 17,
wherein the read circuit is configured to distinguish the first and second voltage ranges and a third voltage range of the difference of the first and second memory cell output voltages,
wherein every value of the first voltage range is positive,
wherein zero is in the second voltage range, and
wherein every value of the third voltage range is negative.

19. The memory system of claim 16, wherein the first memory cell includes:
(a) a first direct band gap semiconductor diode configured to generate fifth light; and
(b) a first photo dot region including a phosphorescent material, wherein in response to the first direct band gap semiconductor diode generating the fifth light, the first photo dot region is configured to absorb at least part of the fifth light and to emit sixth light, and wherein in response to the first photo dot region emitting the sixth light, the first direct band gap semiconductor diode is configured to absorb at least part of the six light and to generate the first memory cell output voltage,
wherein the second memory cell includes:
(a) a second direct band gap semiconductor diode configured to generate seventh light; and
(b) a second photo dot region including the phosphorescent material, wherein in response to the second direct band gap semiconductor diode generating the seventh light, the second photo dot region is configured to absorb at least part of the seventh light and to emit eighth light, and wherein in response to the second photo dot region emitting the eighth light, the second direct band gap semiconductor diode is configured to absorb at least part of the eighth light and to generate the second memory cell output voltage.

20. A memory system operation method, comprising:
providing a combined memory cell, which includes:
a first memory cell which includes first and second memory cell outputs,
wherein the first memory cell is configured for charging to a first arbitrary initial value for a first memory cell output voltage across the first and second memory cell outputs, wherein in response to the first memory cell charging to the first arbitrary initial value for the first memory cell output voltage, the first memory cell is configured to vary the first memory cell output voltage from the first arbitrary initial value towards zero, wherein the second memory cell output is electrically connected to ground, and wherein the first memory cell output is considered a first combined cell output of the combined memory cell,
a second memory cell which includes third and fourth memory cell outputs,
wherein the second memory cell is configured for charging to a second arbitrary initial value for a second memory cell output voltage across the third and fourth memory cell outputs, wherein in response to the second memory cell charging to the second arbitrary initial value for the second memory cell output voltage, the second memory cell is configured to vary the second memory cell output voltage from the second arbitrary initial value towards zero, wherein the fourth memory cell output is electrically connected to ground, and wherein the third memory cell output is considered a second combined cell output of the combined memory cell; and
a read circuit electrically connected to the first and second combined cell outputs, wherein the read circuit is configured to distinguish first and second voltage ranges of a combined cell output voltage across the first and second combined cell outputs of the combined memory cell, and wherein the first and second voltage ranges do not overlap with each other; and performing a first write of a first pre-specified initial value for the combined cell output voltage.

21. The memory system operation method of claim 20, wherein the first and second memory cells comprise first and second photon memory cells, respectively, wherein the first photon memory cell includes the first and second memory cell outputs, and wherein the second photon memory cell includes the third and fourth memory cell outputs.

22. The memory system operation method of claim 21, wherein said performing the first write includes:

charging the first and second photon memory cells to a maximum initial value for the first and second memory cell output voltages, respectively, then decreasing the first and second memory cell output voltages by the first pre-specified initial value; and then charging the first photon memory cell to the maximum initial value, thereby generating the first pre-specified initial value for the combined cell output voltage across the first and second combined cell outputs of the combined memory cell.

23. The memory system operation method of claim 22, wherein the read circuit is configured to distinguish a third voltage range of the combined cell output voltage, wherein the first, second, and third voltage ranges do not overlap one another, wherein the first voltage range is positive, wherein zero is in the second voltage range, and wherein the third voltage range is negative.

24. The memory system operation method of claim 23, further comprising:

performing a second write of a second pre-specified initial value for the combined cell output voltage; and performing a third write of a third pre-specified initial value for the combined cell output voltage, wherein the first pre-specified initial value is positive and in the first voltage range, wherein the second pre-specified initial value is essentially zero and in the second voltage range, and wherein the third pre-specified initial value is negative and in the third voltage range.

\* \* \* \* \*